United States Patent
Gao et al.

(10) Patent No.: US 9,287,726 B2
(45) Date of Patent: Mar. 15, 2016

(54) VIRTUAL CELL FOR BATTERY THERMAL MANAGEMENT

(71) Applicant: THE BOEING COMPANY, Chicago, IL (US)

(72) Inventors: Lijun Gao, Kent, WA (US); Shengyi Liu, Sammamish, WA (US); George M. Roe, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 189 days.

(21) Appl. No.: 14/073,694

(22) Filed: Nov. 6, 2013

(65) Prior Publication Data

US 2015/0123617 A1  May 7, 2015

(51) Int. Cl.

| | |
|---|---|
| *H02J 7/00* | (2006.01) |
| *G01R 31/36* | (2006.01) |
| *H01M 10/44* | (2006.01) |
| *H01M 10/48* | (2006.01) |
| *H02J 7/04* | (2006.01) |
| *H01M 10/633* | (2014.01) |
| *H01M 10/617* | (2014.01) |

(52) U.S. Cl.
CPC ............ *H02J 7/0026* (2013.01); *G01R 31/3606* (2013.01); *G01R 31/3675* (2013.01); *H01M 10/441* (2013.01); *H01M 10/443* (2013.01); *H01M 10/482* (2013.01); *H01M 10/486* (2013.01); *H01M 10/617* (2015.04); *H01M 10/633* (2015.04); *H02J 7/0021* (2013.01); *H02J 7/047* (2013.01)

(58) Field of Classification Search
CPC .......... H02J 7/007; H02J 7/0091; H02J 7/047
USPC ......................................................... 320/118
See application file for complete search history.

(56) References Cited

U.S. PATENT DOCUMENTS

| | | | | |
|---|---|---|---|---|
| 6,099,986 A | * | 8/2000 | Gauthier et al. ............... | 429/120 |
| 6,114,838 A | * | 9/2000 | Brink et al. .................... | 320/136 |

(Continued)

FOREIGN PATENT DOCUMENTS

EP    2645526 A2    10/2013

OTHER PUBLICATIONS

Daowd et al., "Passive and Active Battery Balancing Comparison based on MATLAB Simulation", IEEE, 2011.

(Continued)

*Primary Examiner* — Suchin Parihar
(74) *Attorney, Agent, or Firm* — VISTA IP LAW GROUP LLP; Cynthia A. Dixon

(57) ABSTRACT

A system, method, and apparatus for virtual cells for battery thermal management are disclosed. The disclosed method involves sensing, with at least one temperature sensor, a temperature of at least one battery cell in a battery pack. The method further involves sensing, with at least one current sensor, at least one current within the battery pack. Also, the method involves determining, with a battery thermal management system (BTMS) controller, if the temperature of any of the battery cells in the battery pack exceeds a temperature limit ($T_{Limit}$). Further, the method involves activating, with the BTMS controller, at least one virtual cell to provide current or sink current for at least one of the battery cells in the battery pack that exceeds the temperature limit.

24 Claims, 6 Drawing Sheets

(56) References Cited

U.S. PATENT DOCUMENTS

| | | | |
|---|---|---|---|
| 6,873,134 B2 | 3/2005 | Canter et al. | |
| 7,554,294 B2 | 6/2009 | Srinivasan et al. | |
| 8,212,522 B2* | 7/2012 | Deal et al. | 320/116 |
| 8,907,631 B1* | 12/2014 | Gurries et al. | 320/138 |
| 2005/0001593 A1 | 1/2005 | Kawasumi et al. | |
| 2008/0036425 A1 | 2/2008 | Tashiro et al. | |
| 2008/0212345 A1 | 9/2008 | Yamashita et al. | |
| 2010/0141208 A1* | 6/2010 | Deal et al. | 320/116 |
| 2012/0034501 A1* | 2/2012 | Hermann et al. | 429/62 |
| 2012/0068668 A1* | 3/2012 | Kittell | 320/162 |
| 2012/0176082 A1* | 7/2012 | Lee et al. | 320/103 |
| 2013/0020998 A1 | 1/2013 | Howard | |
| 2014/0349162 A1* | 11/2014 | Koumvakalis et al. | 429/120 |
| 2015/0039255 A1* | 2/2015 | Stewart et al. | 702/63 |
| 2015/0280294 A1* | 10/2015 | Shin et al. | 320/108 |

OTHER PUBLICATIONS

Xie, et al., "State of Health Aware Charge Management in Hybrid Electrical Energy Storage System", EDAA (2012).

Extended European Search Report, Application No. 14191791.4-1359, Mar. 11, 2015.

Canadian Patent Office Office Action, Canadian Patent Application No. 2,862,571, Jun. 1, 2015.

\* cited by examiner

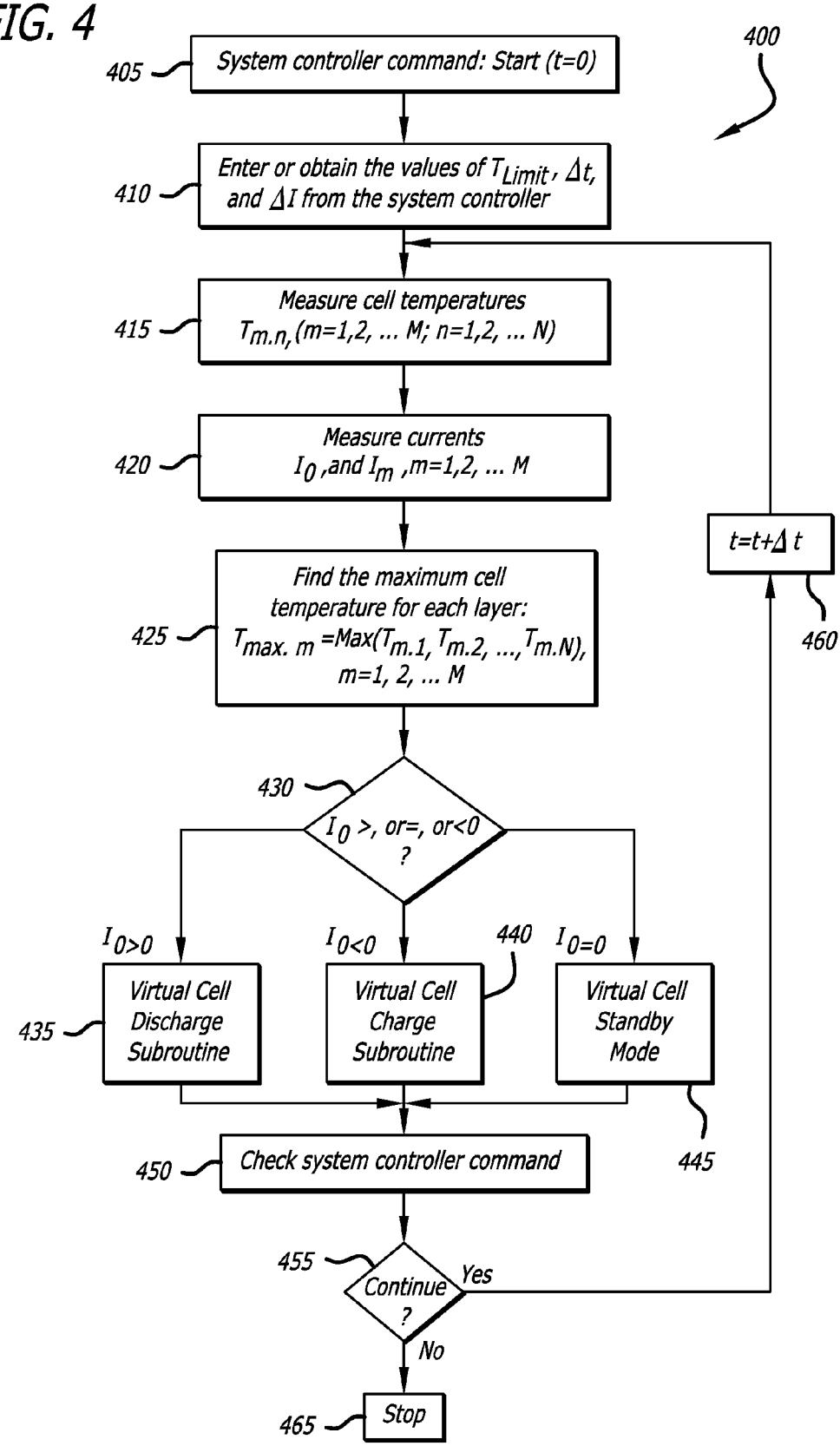

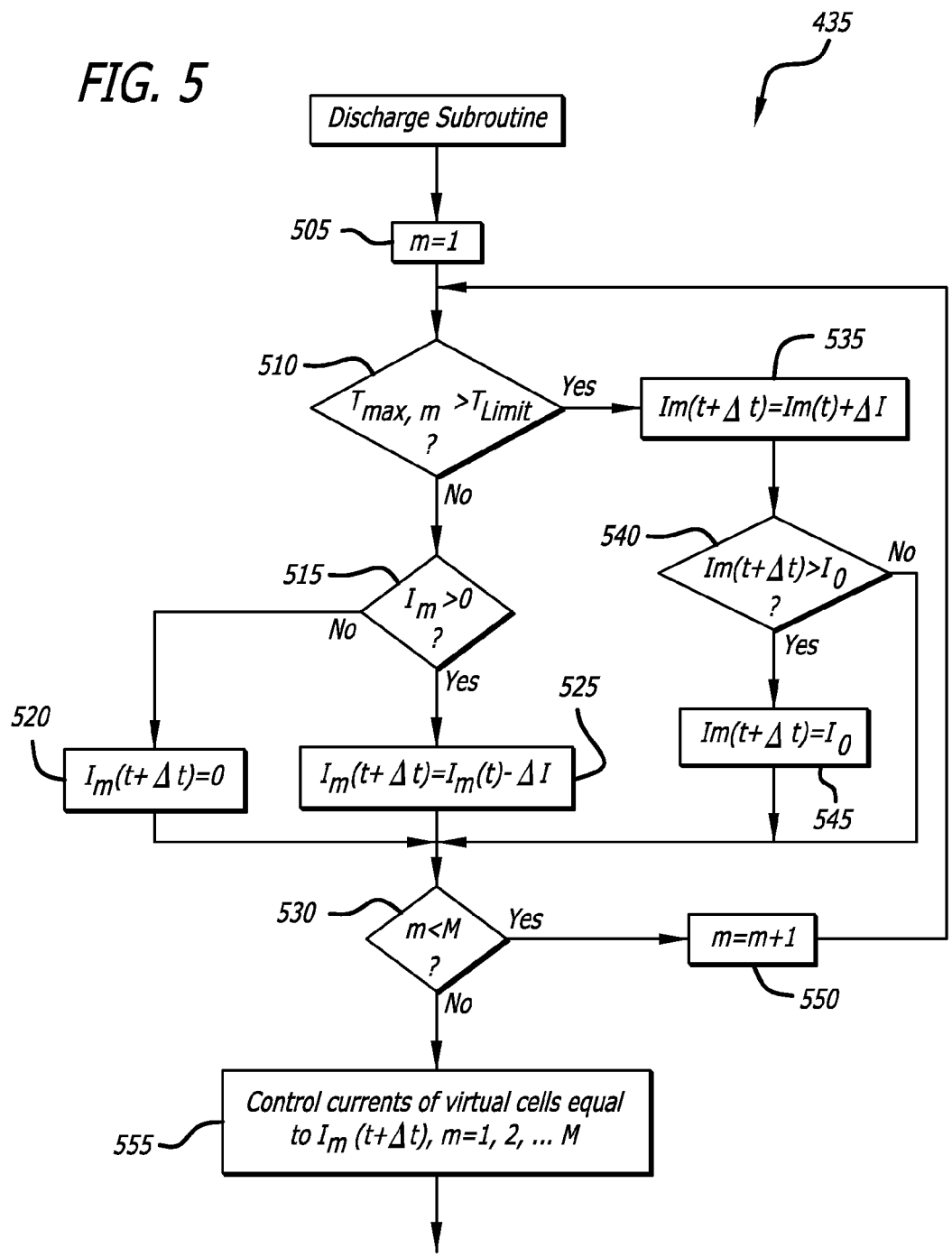

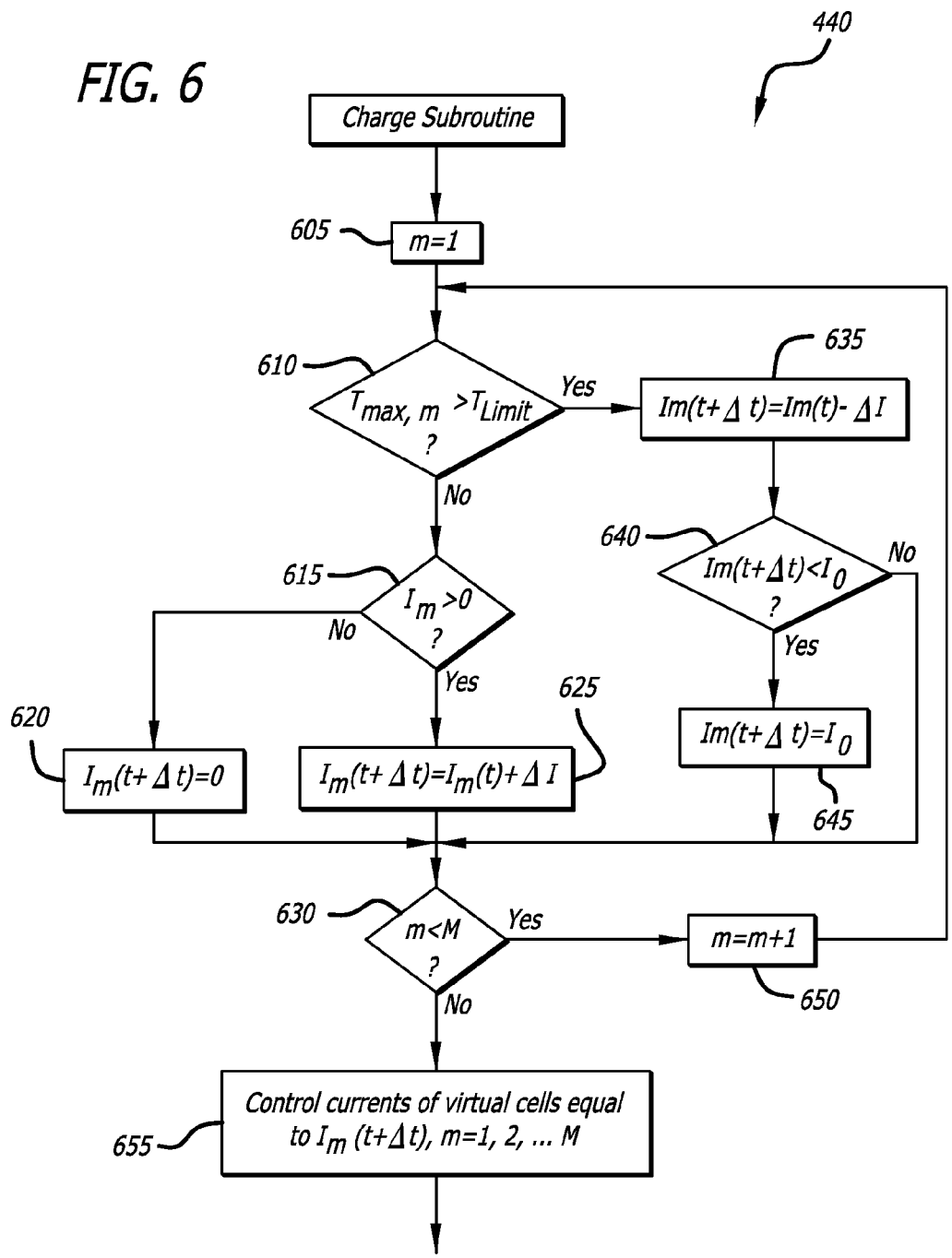

VIRTUAL CELL FOR BATTERY THERMAL MANAGEMENT

FIELD

The present disclosure relates to battery thermal management. In particular, it relates to virtual cells for battery thermal management.

BACKGROUND

Heat generation from a battery is directly related to the current it carries. The higher the current, the more heat is generated. In practice, there exists the possibility that an enormous amount of heat may be generated from the battery that is beyond the capability of an external battery thermal management system to reduce sufficiently. The causes of such high heat generation may be from: (1) an extremely high current resulting from an excess load demand or load fault, (2) a battery internal fault, and/or (3) a charge/discharge circuit failure. Additionally, the heat may accumulate rapidly within the battery if the thermal management system fails or cannot quickly transport the heat out, thereby resulting in very high battery temperature.

Traditional battery thermal management systems provide a means of transporting the heat away from the battery by an external active or passive cooling system. For advanced high energy density batteries (e.g., lithium-type batteries), conventional battery thermal management systems are often inadequate in the event of a fault or a continuous abusive condition. Currently, conventional methods do nothing to control the heat generation from within the battery.

As such, there is a need for an improved battery thermal management system that is able to control the heat generation from within the battery such that the temperature of the battery always remains within a safe limit, without compromising the normal load demand.

SUMMARY

The present disclosure relates to a method, system, and apparatus for virtual cells for battery thermal management. In one or more embodiments, a method for thermal battery management involves sensing, with at least one temperature sensor, a temperature of at least one battery cell in a battery pack. The method further involves sensing, with at least one current sensor, at least one current within the battery pack. Also, the method involves determining, with a battery thermal management system (BTMS) controller, if the temperature of any of the battery cells in the battery pack exceeds a temperature limit ($T_{Limit}$). Further, the method involves activating, with the BTMS controller, at least one virtual cell to provide current or sink current for at least one of the battery cells in the battery pack that exceeds the temperature limit.

In one or more embodiments, the battery cells are arranged in layers in the battery pack. In some embodiments, the battery cells, in each layer, are connected in parallel. In at least one embodiment, the layers are connected in series. In some embodiments, each of the virtual cells is connected to one of the layers of the battery cells.

In at least one embodiment, the method further comprises sending, by at least one temperature sensor, at least one temperature signal to the BTMS controller, where at least one temperature signal comprises information related to the temperature of at least one of the battery cells.

In one or more embodiments, at least one current sensor comprises a battery pack current sensor and/or at least one virtual cell current sensor. In some embodiments, the method further comprises sending, by the battery pack current sensor, at least one current signal to the BTMS controller, where at least one current signal comprises information related to the current ($I_O$) of the battery pack. In at least one embodiment, the method further comprises sending, by at least one virtual cell current sensor, at least one current signal to the BTMS controller, where at least one current signal comprises information related to the current of a layer of the battery cells associated with at least one virtual cell current sensor.

In at least one embodiment, at least one virtual cell is a direct current/direct current (DC/DC) converter and/or an alternating current/direct current (AC/DC) converter. In some embodiments, the DC/DC converter is a bi-directional DC/DC converter. In at least one embodiment, the AC/DC converter is a bi-directional AC/DC converter. In one or more embodiments, the input of the DC/DC converter is connected to terminals of the battery pack or to a DC source. In at least one embodiment, the input of the AC/DC converter is connected to terminals of an AC source.

In one or more embodiments, a system for thermal battery management involves at least one temperature sensor to sense a temperature of at least one battery cell in a battery pack. The system further involves at least one current sensor to sense at least one current within the battery pack. Further, the system involves a battery thermal management system (BTMS) controller to determine if the temperature of any of the battery cells in the battery pack exceeds a temperature limit ($T_{Limit}$), and to activate at least one virtual cell to provide current or sink current for at least one of the battery cells in the battery pack that exceeds the temperature limit.

In at least one embodiment, at least one temperature sensor is further to send at least one temperature signal to the BTMS controller, where at least one temperature signal comprises information related to the temperature of at least one of the battery cells.

In one or more embodiments, at least one current sensor comprises a battery pack current sensor and/or at least one virtual cell current sensor. In at least one embodiment, the battery pack current sensor is to send at least one current signal to the BTMS controller, where at least one current signal comprises information related to the current ($I_O$) of the battery pack. In some embodiments, at least one virtual cell current sensor is to send at least one current signal to the BTMS controller, where at least one current signal comprises information related to the current of a layer of the battery cells associated with at least one virtual cell current sensor.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

FIG. 4 is a flow chart for the disclosed method for the operation of the system for battery thermal management of FIGS. 1 and 2, in accordance with at least one embodiment of the present disclosure.

FIG. 5 is a flow chart for the virtual cell discharge subroutine for the disclosed method of FIG. 4, in accordance with at least one embodiment of the present disclosure.

FIG. 6 is a flow chart for the virtual cell charge subroutine for the disclosed method of FIG. 4, in accordance with at least one embodiment of the present disclosure.

DESCRIPTION

Figure 1:
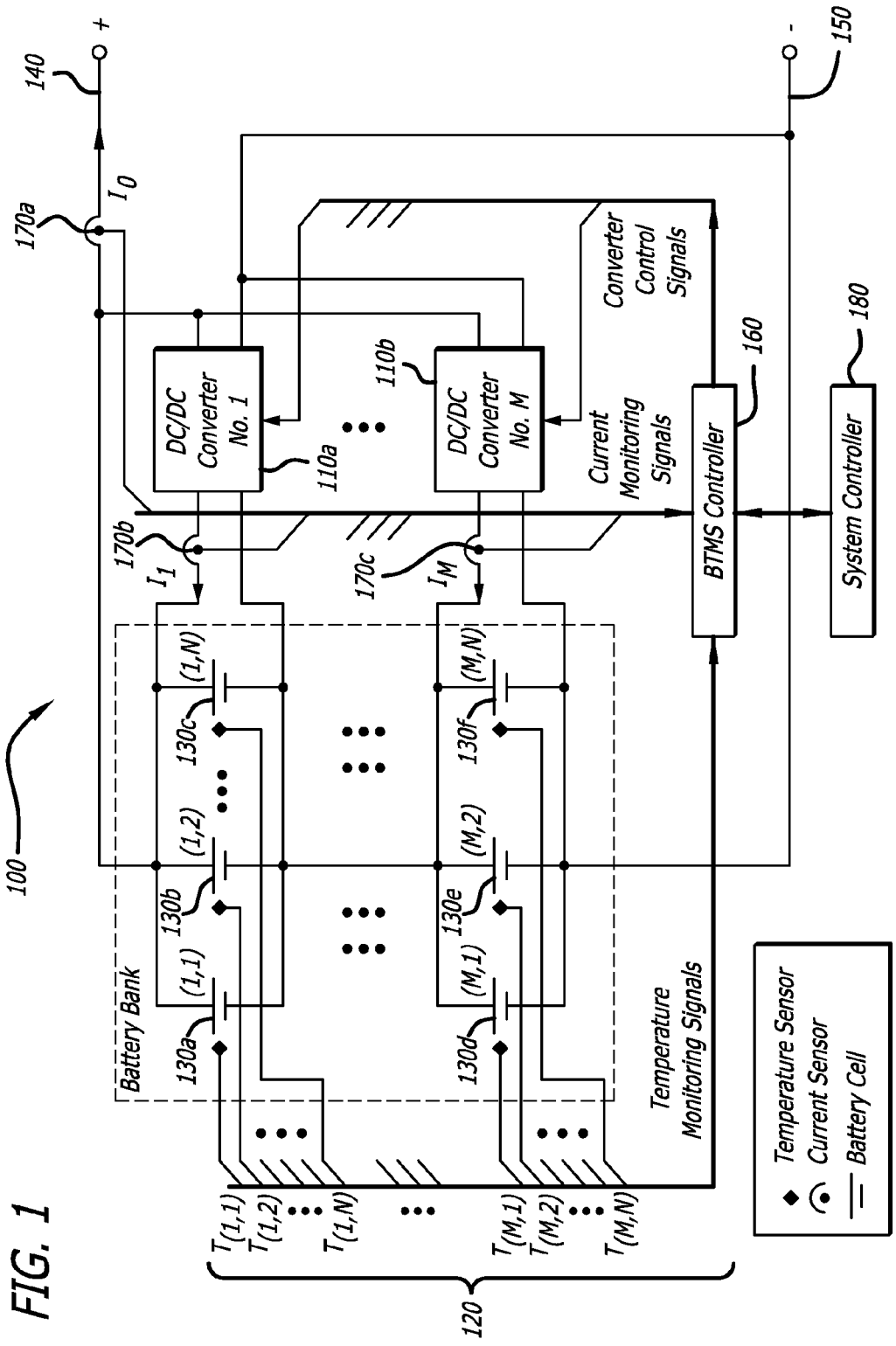
FIG. 1 is a schematic diagram of the disclosed system for battery thermal management employing DC/DC converters for the virtual cells, in accordance with at least one embodiment of the present disclosure.

The methods and apparatus disclosed herein provide an operative system for virtual cells for battery thermal management. The disclosed system provides a solution to control heat generation from within the battery, such that the temperature of the battery is always maintained within a safe limit, without compromising the normal load demand. In particular, during operation of the disclosed system, the system senses the temperatures of individual battery cells, identifies the cell or cells approaching or exceeding a maximum temperature limit, and reduces the current of the compromised cell or cells such that less heat is generated. As such, the system is able to prevent one or more battery cells from overheating and/or achieving thermal runaway.

As previously mentioned above, conventional methods for performing battery thermal management deal only with taking the heat away from the battery externally, either actively or passively. The present disclosure instead directly manages the heat generation from within the battery to perform battery thermal management, along with the use of a conventional external cooling system. The present disclosure requires measurement of the battery cell temperature, and partially focuses on temperature management to prevent overheating.

Specifically, the disclosed system first senses the temperature of individual battery cells, and identifies the battery cell(s) approaching or exceeding a maximum temperature limit. Then, the system reduces the current load of the compromised battery cell(s) such that less heat is generated by the battery cell(s), thereby achieving a lower and stable temperature level. The current deficit created by the load reduction of the compromised battery cell(s) is compensated by a virtual cell(s) (e.g., an actively controlled bi-directional direct current/direct current (DC/DC) converter or an alternating current/direct current (AC/DC) converter) to which the battery cell(s) is connected in parallel.

The disclosed system is capable of: (1) reducing the current of battery cells having a temperature approaching or exceeding a maximum temperature limit, and (2) compensating for the current deficit resulting from the battery cell current reduction by using virtual cells to meet the entire battery current requirement, which is determined by the load. As such, the disclosed system is able to control the battery temperature preemptively, which is not currently possible by conventional battery thermal battery systems. The disclosed system controls the battery heat generation such that the temperature stays within a safe region all of the time, thereby preventing the system from overheating.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

FIG. 1 is a schematic diagram of the disclosed system 100 for battery thermal management employing DC/DC converters 110a, 110b for the virtual cells 110a, 110b, in accordance with at least one embodiment of the present disclosure. In this figure, there are six main elements depicted for the system 100. The first main element is the battery pack 120 (e.g., an array of battery cells, which is also referred to as a "battery array"). The battery pack 120 consists of M×N number of battery cells 130a-130f, where there are M number of layers (i.e. rows) and N number of cells (i.e. columns) in each layer. The battery cells 130a-130f are interconnected such that each layer of the total M layers has N battery cells 130a-130c connected in parallel, and the total M battery cells layers are connected in series. This configuration creates an M×N battery array 120.

The numbers M and N may be arbitrary, but M is greater than or equal to (≥) one (1) and N≥1. For the battery cell 130f positioned at the Mth layer and the Nth column, the variables of that battery cell 130f are designated by the subscripts (M, N). The positive terminals of the top layer of battery cells 130a-130c are connected together, and form the positive terminal 140 of the battery pack 120. The negative terminals of the bottom layer battery cells 130d-130f are connected together, and form the negative terminal 150 of the battery pack 120.

The second main element is the virtual cells 110a, 110b. In this figure, a DC/DC converter is employed for each of the virtual cells 110a, 110b. Any type of current bi-directional DC/DC converters may be used for the virtual cells 110a, 110b. Also, one virtual cell 110a, 110b is employed for each layer of battery cells 130a-130f (e.g., one virtual cell 110a is employed for the top layer of the battery cells 130a-130c, and the virtual cell 110b is employed for the bottom layer of battery cells 130d-130f) and, as such, there are a total of M number of virtual cells 110a, 110b. The output positive and negative terminals of each virtual cell 110a, 110b are connected to the positive and negative terminals of the virtual cell's corresponding battery cell layer 130a-130c, 130d-130f. The input positive and negative terminals of each virtual cell are connected to the positive 140 and negative 150 terminals of the battery pack 120. It should be noted that in other embodiments, the input positive and negative terminals of each virtual cell are connected to terminals of a DC source instead of to the terminals of the battery pack 120. It should also be noted that in other embodiments (refer to FIG. 2), an AC/DC converter may be employed for each of the virtual cells 110a, 110b.

The third main element is the battery cell temperature sensors, which are denoted in the figure by a diamond symbol. The temperature of each battery cell 130a-130f is sensed by a temperature sensor, and the temperature sensor sends a temperature signal, containing information regarding the sensed temperature, to the battery thermal management system (BTMS) controller 160. For the battery cell 130f of the Mth layer and the Nth column, the temperature is designed as $T_{M,N}$. In this figure, a temperature sensor for each battery cell 130a-130f is employed. However, it should be noted that in other embodiments, more or less temperature sensors for each battery cell 130a-130f may be employed. For example, more temperature sensors may be employed for the more critical battery cells.

The fourth main element is current sensors 170a-170c (i.e. current sensors for the battery cells (i.e. the battery array) and the virtual cells), which are denoted in the figure as a dot surrounded by a semicircle. In this figure, a current sensor 170a is employed for the battery pack 120, and for each of the virtual cells 110a, 110b. The battery pack current is designated as $I_O$, with the positive direction as shown by the arrow. The current of the Mth virtual cell is designated as $I_M$, with the positive direction as shown by the arrow. The current of the battery pack 120 is sensed by the battery pack current sensor 170a and the currents of the virtual cells 110a, 110b are sensed by virtual cells current sensors 170b, 170c; and the battery pack current sensor 170a and the virtual cells current sensors 170b, 170c each send a current signal, containing information regarding the sensed current, to the BTMS controller 160.

The fifth main element is the BTMS controller 160. The BTMS controller 160 may be implemented using digital and/or analog electronics. The BTMS controller 160 receives the temperature signals and the current signals. The BTMS controller 160 makes specific control decisions for each of the M number of virtual cells 110a, 110b according to the received temperature signals and current signals. The BTMS controller 160 then sends out control signals related to the control decisions to the virtual cells 110a, 110b.

The sixth main element is the system controller 180. The system controller 180 is interfaced with the BTMS controller 160. The system controller 180 is responsible for sending system command and control signals to the BTMS controller 160, and receiving the temperature and current signals from the BTMS controller 160. The system controller 160 is also responsible for interfacing with other management systems including, but not limited to, the battery charge/discharge control system, and battery over-current protection system, the short circuit protection system, the battery life management system, and the power distribution control system.

As previously mentioned, the battery cell heat generation is directly related to the current is carries. The battery cell temperature becomes higher when the current is higher, and if the heat cannot be transported away immediately by the external cooling system, an overheating condition may occur. The fundamental mechanism to prevent this from happening, by the disclosed BTMS controller 160, is to reduce the intensity of the heat source (i.e. reduce the current). The deficit of the battery cell current as a result of current reduction is compensated by the virtual cell(s) 110a, 110b.

During operation of the system, the system controller 180 passes the battery cell temperature limit $T_{Limit}$ to the BTMS controller 160. Then, the BTMS controller 160 constantly monitors the battery cell temperatures, and picks out the battery cells 130a-130f exhibiting the maximum temperatures in their corresponding battery cell layers. If the maximum temperature of a battery cell 130a-130f in a certain layer of battery cells approaches and/or exceeds the temperature limit ($T_{Limit}$), the virtual cell 110a, 110b corresponding to that battery cell layer is activated, by receiving a control signal from the BTMS controller 160, to provide a current or to sink a current. As such, the battery cell current in that battery cell layer is reduced and, thus, the heat production is decreased.

In one or more embodiments, the current increment $\Delta I$, is set by the system controller 180, and may depend upon a specific battery system design. For each time step $\Delta t$ during operation, if a battery cell temperature over the temperature limit is detected, the current of the corresponding virtual cell 110a, 110b is adjusted by $\Delta I$. The process continues until the system controller 180 sends a command signal to stop. A detailed description of the control algorithm for the BTMS controller 160 is described in the description of FIGS. 4, 5, and 6.

Figure 2:
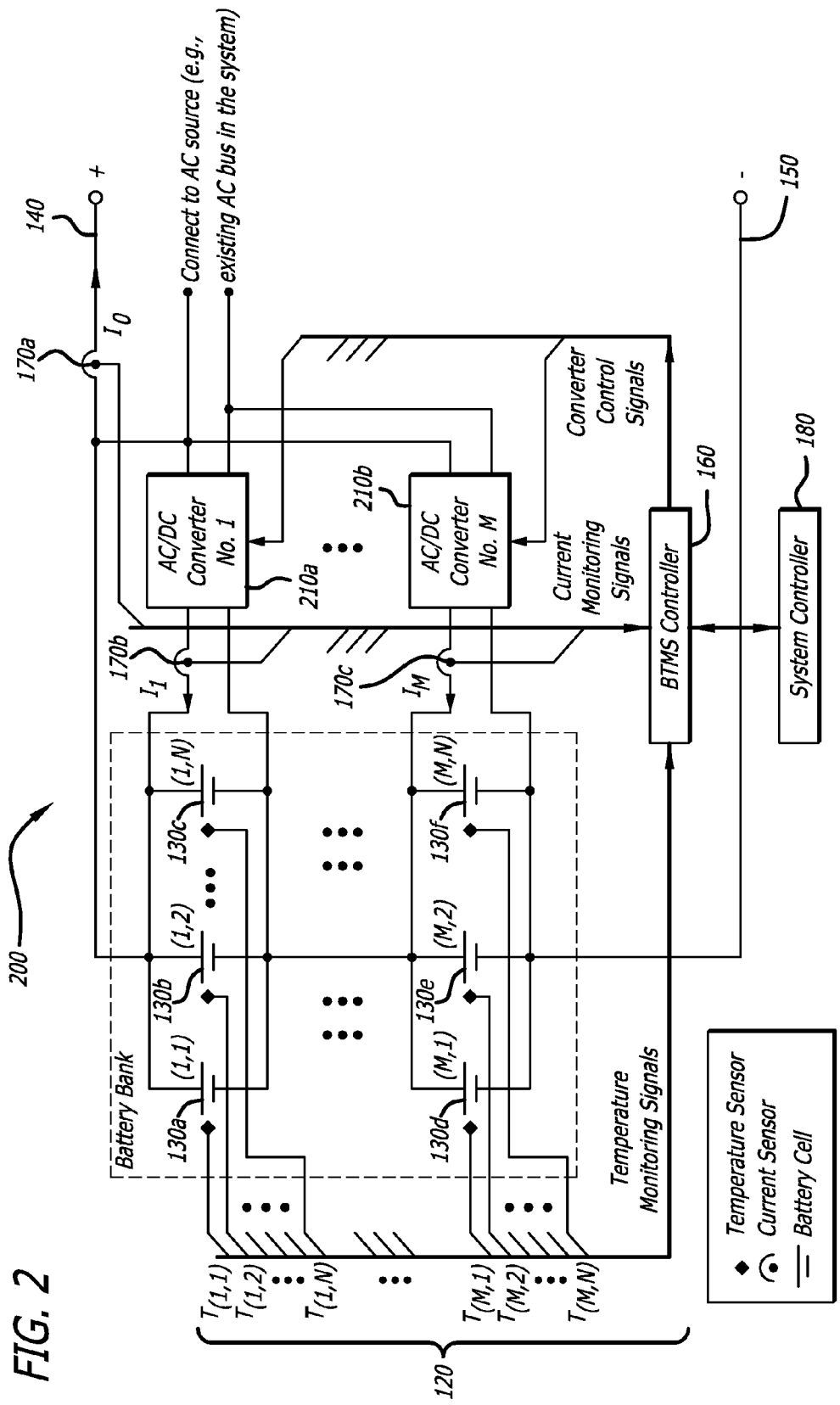
FIG. 2 is a schematic diagram of the disclosed system for battery thermal management employing AC/DC converters for the virtual cells, in accordance with at least one embodiment of the present disclosure.

FIG. 2 is a schematic diagram of the disclosed system 200 for battery thermal management employing AC/DC converters 210a, 210b for the virtual cells 210a, 210b, in accordance with at least one embodiment of the present disclosure. The system 200 of FIG. 2 is the same as the system 100 of FIG. 1 except that for the system 200 of FIG. 2, AC/DC converters 210a, 210b are employed for the virtual cells 210a, 210b instead of DC/DC converters 110a, 110b. Any type of current bi-directional AC/DC converters 210a, 210b may be used for the virtual cells. In addition, the input positive and negative terminals of each AC/DC converters 210a, 210b are connected to the positive 240 and negative 250 terminals of an AC source 260 (e.g., an existing AC bus in the system).

Figure 3:
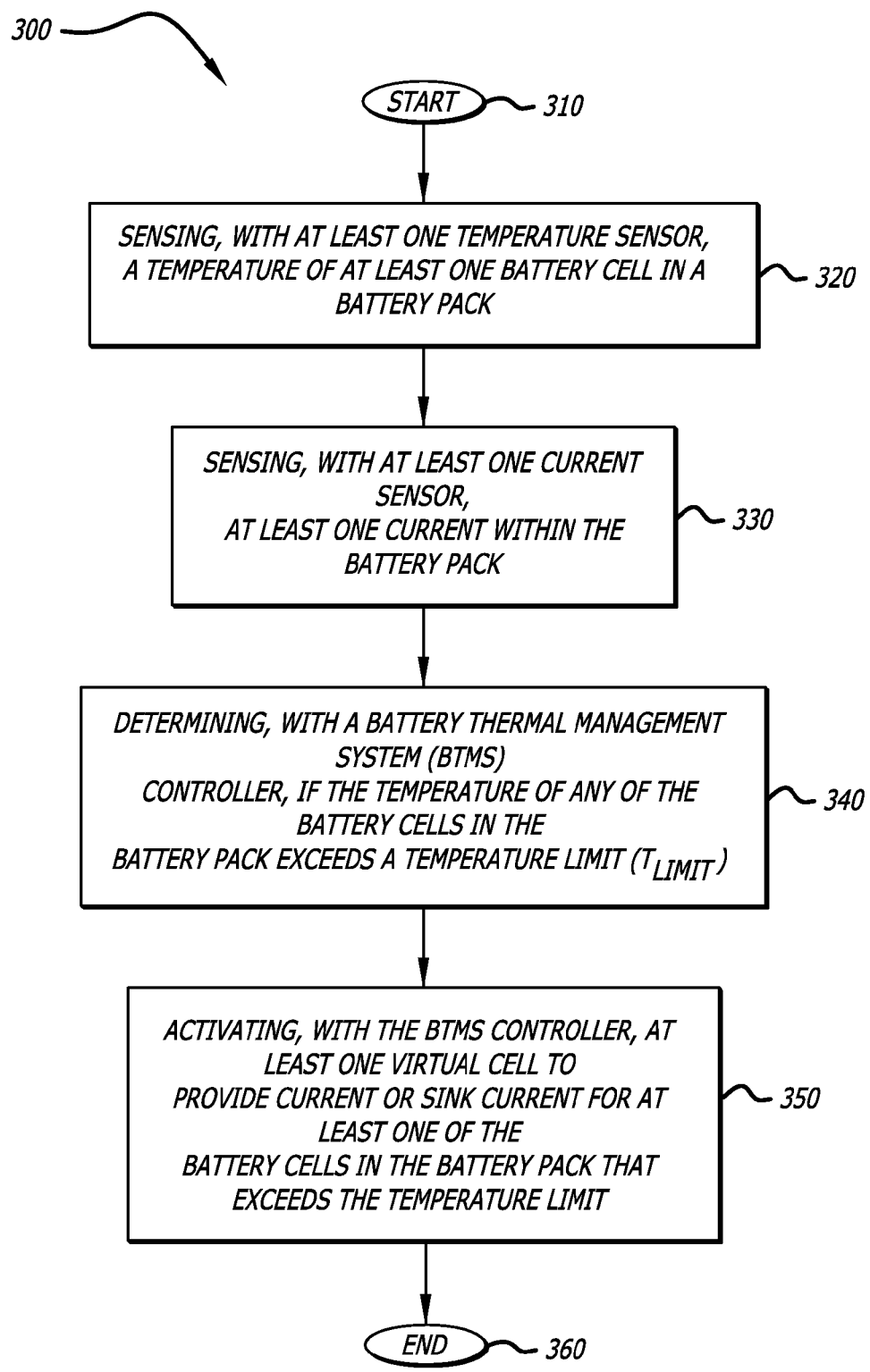
FIG. 3 is a flow chart for an overview of the disclosed method for the operation of the system for battery thermal management of FIGS. 1 and 2, in accordance with at least one embodiment of the present disclosure.

FIG. 3 is a flow chart for an overview of the disclosed method 300 for the operation of the system for battery thermal management of FIGS. 1 and 2, in accordance with at least one embodiment of the present disclosure. In this figure, at the start 310 of the method 300, at least one temperature sensor senses a temperature of at least one battery cell in the battery pack 320. At least one current sensor senses at least one current within the battery pack 330. Then, a battery thermal management system (BTMS) controller determines if the temperature of any of the battery cells in the battery pack exceeds a temperature limit ($T_{Limit}$) 340. The BTMS controller activates at least one virtual cell to provide current or to sink current for at least one of the battery cells in the battery pack that exceeds the temperature limit 350. Then, the method 300 ends 360.

FIG. 4 is a flow chart for the disclosed method 400 for the operation of the system 100, 200 for battery thermal management of FIGS. 1 and 2, in accordance with at least one embodiment of the present disclosure. In this figure, at the start of the method 400, the BTMS controller receives a start command of time (t)=0 (i.e. to initialize the start time equal to zero) from the system controller 405. Then, the BTMS controller enters or obtains the values of $T_{Limit}$ (i.e. the temperature limit for the battery cells), $\Delta t$ (i.e. the time increment), and $\Delta I$ (i.e. the current increment) from the system controller 410. The temperature sensors measure the battery cell temperatures ($T_{m,n}$, where m=1, 2, ... M and n=1, 2, ... N) 415. The current sensors measure the currents ($I_O$ and $I_m$, where m=1, 2, ... M) 420. The BTMS controller than finds the maximum battery cell temperature for each layer ($T_{max,m}$=Max($T_{m,1}, T_{m,2}, ... T_{m,N}$), where m=1, 2, ... M) 425.

Then, the BTMS controller determines whether the battery pack current $I_O$ is greater than, equal to, or less than zero (0) (i.e. $I_O$>, or=, or<0) 430. If the battery pack current $I_O$ is greater than zero, the BTMS controller will execute the virtual cell discharge subroutine 435, which will be described in the description of FIG. 5. And, if the battery pack current $I_O$ is less than zero, the BTMS controller will execute the virtual cell charge subroutine 440, which will be described in the description of FIG. 6. However, if the battery pack current $I_O$ is equal to zero, the BTMS controller will keep the virtual cell in standby mode 445 (e.g., the BTMS controller will essentially do nothing), and the BTMS controller will check the latest command from the system controller 450.

After the BTMS controller has executed the virtual cell discharge subroutine 435 or the virtual cell charge subroutine 440 or the standby mode 445, the BTMS controller will check the latest command from the system controller 450. The BTMS controller will determine if the command is to continue 455. If the command is to continue, the method 400 will proceed to step 415. However, if the command is not to continue, the method 400 will stop 465.

FIG. 5 is a flow chart for the virtual cell discharge subroutine 435 for the disclosed method 400 of FIG. 4, in accordance with at least one embodiment of the present disclosure. In this figure, at the start of the discharge subroutine 435, m is set equal to 1 (i.e. m=1) so that the method starts from the first layer (i.e. layer 1) 505. The BTMS controller determines if the maximum temperature of the layer is greater than the temperature limit (i.e. $T_{max,m} > T_{Limit}$?) 510.

If the BTMS controller determines that the maximum temperature is not greater than the temperature limit, the BTMS controller determines if the current for the virtual cell for the layer is greater than zero (i.e. $I_m > 0$?) 515. If the BTMS controller determines that the current for the virtual cell is not greater than zero, then the battery cell layer does not need support from the virtual cell and, as such, a zero value is set as a reference for the virtual cell (i.e. $I_m(t+\Delta t)=0$) 520. Then, the subroutine 435 will proceed to step 530. However, If the BTMS controller determines that the current for the virtual cell is greater than zero, then the layer is receiving support from the virtual cell (i.e. the virtual cell is providing a portion of the battery cell current), and the BTMS controller will decrease the current of the virtual cell by $\Delta I$ (i.e. $I_m(t+\Delta t)=I_m(t)-\Delta I$) 525. Then, the subroutine 435 will proceed to step 530.

However, if the BTMS controller determines that the maximum temperature is greater than the temperature limit, the BTMS controller will increase the current of the virtual cell by $\Delta I$ (i.e. $I_m(t+\Delta t)=I_m(t)+\Delta I$) to lower the current of the battery cells in the layer 535. Then, the BTMS controller will check the new increased current setting of the virtual cell to determine if it is greater than the battery pack current (i.e. $I_m(t+\Delta t) > I_0$?) 540. If the BTMS controller determines that the current of the virtual cell is greater than the battery pack current, the BTMS controller will limit the virtual cell current to the battery pack current (i.e. $I_m(t+\Delta t)=I_0$) 545. Then, the subroutine 435 will proceed to step 530. However, if the BTMS controller determines that the current of the virtual cell is not greater than the battery pack current, then the subroutine 435 will proceed to step 530.

At step 530, the BTMS controller determines whether m is less than M (i.e. m<M?) 530. If the BTMS controller determines that m is less than M, the BTMS controller will set m equal to m plus 1 (i.e. m=m+1) so that the method will restart (by returning back to step 510) from the next layer (i.e. layer 2) 550. The subroutine 435 then proceeds to step 510. However, if the BTMS controller determines that m is not less than M, the BTMS controller will control the currents of the virtual cells to be equal to $I_m(t+\Delta t)$, where m=1, 2, . . . M 555. Then, the subroutine 435 proceeds to step 450 of method 400 (refer to FIG. 4).

FIG. 6 is a flow chart for the virtual cell charge subroutine 440 for the disclosed method 400 of FIG. 4, in accordance with at least one embodiment of the present disclosure. In this figure, at the start of the discharge subroutine 440, m is set equal to 1 (i.e. m=1) so that the method starts from the first layer (i.e. layer 1) 605. The BTMS controller determines if the maximum temperature of the layer is greater than the temperature limit (i.e. $T_{max,m} > T_{Limit}$?) 610.

If the BTMS controller determines that the maximum temperature is not greater than the temperature limit, the BTMS controller determines if the current for the virtual cell for the layer is less than zero (i.e. $I_m < 0$?) 615. If the BTMS controller determines that the current for the virtual cell is not less than zero, then the battery cell layer does not need support from the virtual cell and, as such, a zero value is set as a reference for the virtual cell (i.e. $I_m(t+\Delta t)=0$) 620. Then, the subroutine 440 will proceed to step 630. However, If the BTMS controller determines that the current for the virtual cell is less than zero, then the layer is receiving support from the virtual cell (i.e. the virtual cell is sinking a portion of the battery cell current), and the BTMS controller will increase the current of the virtual cell by $\Delta I$ (i.e. $I_m(t+\Delta t)=I_m(t)+\Delta I$) 525. Then, the subroutine 440 will proceed to step 630.

However, if the BTMS controller determines that the maximum temperature is greater than the temperature limit, the BTMS controller will control the virtual cell to sink more current by $\Delta I$ (i.e. $I_m(t+\Delta t)=I_m(t)-\Delta I$) to lower the current of the battery cells in the layer 635. Then, the BTMS controller will check the new current setting of the virtual cell to determine if it is less than the battery pack current (i.e. $I_m(t+\Delta t) < I_0$?) 640. If the BTMS controller determines that the current of the virtual cell is less than the battery pack current, the BTMS controller will limit the virtual cell current to the battery pack current (i.e. $I_m(t+\Delta t)=I_0$) 645. Then, the subroutine 440 will proceed to step 630. However, if the BTMS controller determines that the current of the virtual cell is not less than the battery pack current, then the subroutine 440 will proceed to step 630.

At step 630, the BTMS controller determines whether m is less than M (i.e. m<M?) 630. If the BTMS controller determines that m is less than M, the BTMS controller will set m equal to m plus 1 (i.e. m=m+1) so that the method will restart (by returning back to step 610) from the next layer (i.e. layer 2) 650. The subroutine 440 then proceeds to step 610. However, if the BTMS controller determines that m is not less than M, the BTMS controller will control the currents of the virtual cells to be equal to $I_m(t+\Delta t)$, where m=1, 2, . . . M 655. Then, the subroutine 440 proceeds to step 450 of method 400 (refer to FIG. 4).

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the invention. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for thermal battery management, the method comprising:
 sensing, with at least one temperature sensor, a temperature of at least one battery cell in a battery pack;
 sensing, with at least one current sensor, at least one current within the battery pack;

determining if the temperature of any of the battery cells in the battery pack exceeds a temperature limit ($T_{Limit}$); and activating at least one virtual cell to provide current or sink current for at least one of the battery cells in the battery pack that exceeds the temperature limit, wherein the battery cells are arranged in layers in the battery pack, and wherein the battery cells, in each layer, are connected in parallel.

2. The method of claim 1, wherein the layers are connected in series.

3. The method of claim 1, wherein each of the virtual cells is connected to one of the layers of the battery cells.

4. The method of claim 1, wherein the method further comprises sending, by the at least one temperature sensor, at least one temperature signal to a BTMS controller, wherein the at least one temperature signal comprises information related to the temperature of at least one of the battery cells.

5. The method of claim 1, wherein the at least one current sensor comprises at least one of a battery pack current sensor and at least one virtual cell current sensor.

6. The method of claim 5, wherein the method further comprises sending, by the battery pack current sensor, at least one current signal to a BTMS controller, wherein the at least one current signal comprises information related to the current ($I_0$) of the battery pack.

7. The method of claim 5, wherein the method further comprises sending, by the at least one virtual cell current sensor, at least one current signal to a BTMS controller, wherein the at least one current signal comprises information related to the current of a layer of the battery cells associated with the at least one virtual cell current sensor.

8. The method of claim 1, wherein the at least one virtual cell is at least one of a direct current/direct current (DC/DC) converter and an alternating current/direct current (AC/DC) converter.

9. The method of claim 8, wherein the DC/DC converter is a bi-directional DC/DC converter.

10. The method of claim 8, wherein the AC/DC converter is a bi-directional AC/DC converter.

11. The method of claim 8, wherein an input of the DC/DC converter is connected to one of terminals of the battery pack and a DC source.

12. The method of claim 8, wherein an input of the the AC/DC converter is connected to terminals of an AC source.

13. A system for thermal battery management, the system comprising:

at least one temperature sensor to sense a temperature of at least one battery cell in a battery pack;

at least one current sensor to sense at least one current within the battery pack; and a battery thermal management system (BTMS) controller to determine if the temperature of any of the battery cells in the battery pack exceeds a temperature limit ($T_{Limit}$), and to activate at least one virtual cell to provide current or sink current for at least one of the battery cells in the battery pack that exceeds the temperature limit, wherein the battery cells are arranged in layers in the battery pack, and wherein the battery cells, in each layer, are connected in parallel.

14. The system of claim 13, wherein the layers are connected in series.

15. The system of claim 13, wherein each of the virtual cells is connected to one of the layers of the battery cells.

16. The system of claim 13, wherein the at least one temperature sensor is further to send at least one temperature signal to the BTMS controller, wherein the at least one temperature signal comprises information related to the temperature of at least one of the battery cells.

17. The system of claim 13, wherein the at least one current sensor comprises at least one of a battery pack current sensor and at least one virtual cell current sensor.

18. The system of claim 17, wherein the battery pack current sensor is to send at least one current signal to the BTMS controller, wherein the at least one current signal comprises information related to the current ($I_0$) of the battery pack.

19. The system of claim 17, wherein the at least one virtual cell current sensor is to send at least one current signal to the BTMS controller, wherein the at least one current signal comprises information related to the current of a layer of the battery cells associated with the at least one virtual cell current sensor.

20. The system of claim 13, wherein the at least one virtual cell is at least one of a direct current/direct current (DC/DC) converter and an alternating current/direct current (AC/DC) converter.

21. The system of claim 20, wherein the DC/DC converter is a bi-directional DC/DC converter.

22. The system of claim 20, wherein the AC/DC converter is a bi-directional AC/DC converter.

23. The system of claim 20, wherein an input of the the DC/DC converter is connected to one of terminals of the battery pack and a DC source.

24. The system of claim 20, wherein an input of the AC/DC converter is connected to terminals of an AC source.

\* \* \* \* \*